(12) United States Patent
Lee et al.

(10) Patent No.: US 8,268,726 B2
(45) Date of Patent: Sep. 18, 2012

(54) METHOD FOR FABRICATING SEMICONDUCTOR DEVICE

(75) Inventors: Hae-Jung Lee, Gyeonggi-do (KR);
Kang-Pok Lee, Gyeonggi-do (KR);
Kyeong-Hyo Lee, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 103 days.

(21) Appl. No.: 12/833,081

(22) Filed: Jul. 9, 2010

(65) Prior Publication Data
US 2011/0159687 A1    Jun. 30, 2011

(30) Foreign Application Priority Data
Dec. 30, 2009   (KR) .................. 10-2009-0134165

(51) Int. Cl.
*H01L 21/302* (2006.01)

(52) U.S. Cl. .................. 438/689; 257/E21.224

(58) Field of Classification Search ............. 438/8, 494, 438/498, 504, 689, 697, 738, 745, 924; 257/E21.224
See application file for complete search history.

(56) References Cited

U.S. PATENT DOCUMENTS

| | | | |
|---|---|---|---|
| 5,976,444 A * | 11/1999 | Pearson et al. ......... | 264/255 |
| 6,020,639 A * | 2/2000 | Ulrich et al. ......... | 257/750 |
| 6,066,028 A * | 5/2000 | Cheng et al. ......... | 451/28 |
| 6,252,725 B1 * | 6/2001 | Tran et al. ......... | 359/811 |
| 6,770,565 B2 * | 8/2004 | Olgado et al. ......... | 438/706 |
| 7,821,068 B2 * | 10/2010 | Wu et al. ......... | 257/347 |
| 2003/0077894 A1 * | 4/2003 | Ryu ......... | 438/622 |
| 2004/0051127 A1 * | 3/2004 | Tanaka ......... | 257/296 |
| 2005/0026437 A1 * | 2/2005 | Ma et al. ......... | 438/689 |
| 2005/0085163 A1 * | 4/2005 | Hsu et al. ......... | 451/11 |
| 2005/0280078 A1 * | 12/2005 | Teramae et al. ......... | 257/330 |

FOREIGN PATENT DOCUMENTS

| | | |
|---|---|---|
| KR | 1020010039837 | 5/2001 |
| KR | 1020040096011 | 11/2004 |

OTHER PUBLICATIONS

Notice of Allowance issued from Korean Intellectual Property Office on Aug. 23, 2011.

* cited by examiner

*Primary Examiner* — Kiesha R. Bryant
*Assistant Examiner* — Ali Naraghi
(74) *Attorney, Agent, or Firm* — IP & T Group LLP

(57) ABSTRACT

A method for fabricating a semiconductor device includes forming a plurality of plugs over a die region and an edge bead removal (EBR) region of a wafer, forming metal lines coupled to the plugs, removing the metal lines in the EBR region, forming an inter-layer dielectric layer over the wafer, and forming a plurality of contact holes that expose the metal lines by selectively etching the inter-layer dielectric layer through a dry etch process using a plasma etch device.

12 Claims, 5 Drawing Sheets

METHOD FOR FABRICATING SEMICONDUCTOR DEVICE

CROSS-REFERENCE TO RELATED APPLICATIONS

The present application claims priority of Korean Patent Application No. 10-2009-0134165, filed on Dec. 30, 2009, which is incorporated herein by reference in its entirety.

BACKGROUND OF THE INVENTION

Exemplary embodiments of the present invention relate to a method for fabricating a semiconductor device, and more particularly, to a semiconductor device fabrication method that prevents an arcing failure from occurring in an edge bead removal (EBR) region of a wafer.

As the integration degree of a semiconductor device increases, it is desirable to decrease the line width of metal lines. It has been difficult to use conventional methods for forming the metal lines and satisfy the desired line width of the metal lines. To address these concerns, metal lines have been formed through a Damascene process. According to the Damascene process, a Chemical Mechanical Polishing (CMP) process is performed as a planarization process in order to form metal lines and electrically insulate the metal lines from each other.

FIGS. 1A to 1D are cross-sectional views illustrating a conventional method for forming a metal line.

Referring to FIG. 1A, a first inter-layer dielectric layer is formed over a wafer 11 which has a die region where a semiconductor device is formed and an EBR region on the outskirt of the wafer 11. The first inter-layer dielectric layer is selectively etched to form a plurality of first contact holes 13. Hereafter, the selectively etched first inter-layer dielectric layer will be referred to as a first inter-layer dielectric layer pattern 12.

Subsequently, a conductive layer for plugs is deposited over the wafer 11 to fill the first contact holes 13, and a planarization process, e.g., a CMP process, is performed in such a manner that the upper surface of the first inter-layer dielectric layer pattern 12 is exposed. As a result, plugs 14 are formed.

Referring to FIG. 1B, a second inter-layer dielectric layer is formed over the wafer 11 and the second inter-layer dielectric layer is selectively etched to form trenches 16 for metal lines. Hereafter, the selectively etched second inter-layer dielectric layer will be referred to as a second inter-layer dielectric layer pattern 15.

Subsequently, a metal layer is deposited over the wafer 11 to fill the trenches 16, and a planarization process, e.g., a CMP process, is performed in such a manner that the upper surface of the second inter-layer dielectric layer pattern 15 is exposed. As a result, metal lines 17 are formed.

Referring to FIG. 1C, a third inter-layer dielectric layer 18 is formed over the wafer 11, and a photoresist pattern 19 for forming contact holes which exposes the metal lines 17 is formed over the third inter-layer dielectric layer 18.

Referring to FIG. 1D, the third inter-layer dielectric layer 18 is etched using the photoresist pattern 19 as an etch barrier to form second contact holes 20 which expose the metal lines 17. Herein, the etched third inter-layer dielectric layer 18 will be referred to as a third inter-layer dielectric layer pattern 18A.

When the structures are formed in the die region of the wafer 11 according to the conventional technology, a dummy structure which is the same as the structure formed in the die region is also formed in the EBR region on the outskirt of the wafer 11. This is to prevent a step height between the structures on the wafer 11 and to secure polishing uniformity during the planarization process.

However, since in the EBR region for a dummy structure, a process according to a conventional technology may be performed abnormally, defects such as abnormal formation of the plugs 14 occur frequently due to impurities or other reasons during the formation of the first contact holes 13 and the plugs 14 (see reference symbol 'A' of FIG. 1A).

Due to the defect in the formation of the plugs 14, which is connected to the metal lines 17, in the EBR region, a cut-off in the current flow from the metal lines 17 to the wafer 11 in the EBR region may occur, and as a result, there is a concern that an arcing failure occurs due to a potential difference induced during a dry etch process using a plasma etch device (see FIG. 1D).

The arcing refers to a phenomenon that an inter-layer dielectric layer is broken down by high electric power used during the plasma etch process of the inter-layer dielectric. In a severe case, the conductive layer in the lower portion of the inter-layer dielectric layer may be fused or peeling may occur (see reference symbol 'B ' of FIG. 1D). Also, the inter-layer dielectric layer broken down due to the arcing phenomenon and the conductive layer in the lower portion of the inter-layer dielectric layer function as particles, and the reliability of the semiconductor device is deteriorated.

SUMMARY OF THE INVENTION

Exemplary embodiments of the present invention, which are designed to address the above discussed concerns of the conventional technology, are directed to a method for fabricating a semiconductor device that can prevent an arcing failure from occurring in an edge bead removal (EBR) region on the outskirt of a wafer.

In accordance with an embodiment of the present invention, a method for fabricating a semiconductor device includes: forming a plurality of plugs over a die region and an edge bead removal (EBR) region of a wafer; forming metal lines coupled to the plugs; removing the metal lines in the EBR region; forming an inter-layer dielectric layer over the wafer; and forming a plurality of contact holes that expose the metal lines by selectively etching the inter-layer dielectric layer through a dry etch process using a plasma etch device.

In removing the metal lines in the EBR region, the metal lines may be removed through a wet etch process.

DESCRIPTION OF SPECIFIC EMBODIMENTS

Figure 1A:
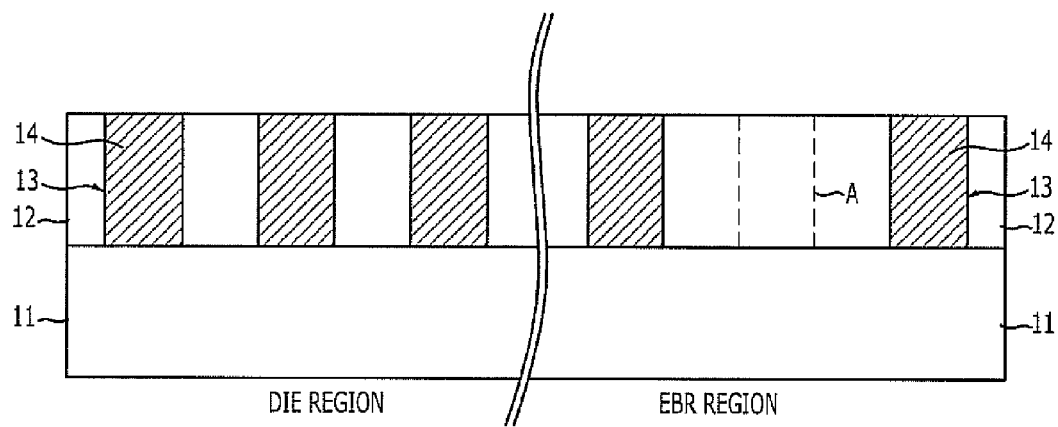
FIGS. 1A to 1D are cross-sectional views illustrating a conventional method for forming a metal line.
Figure 1B:
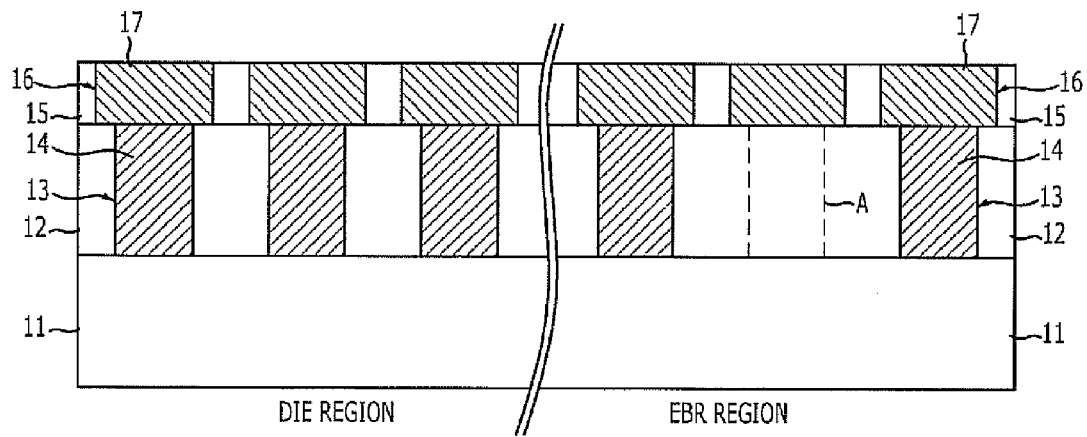
Figure 1C:
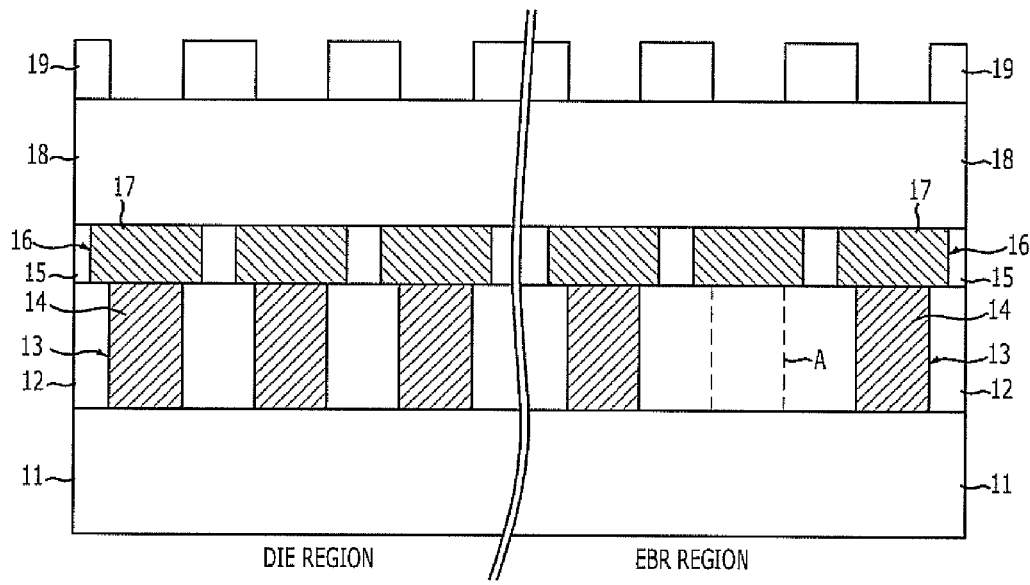
Figure 1D:
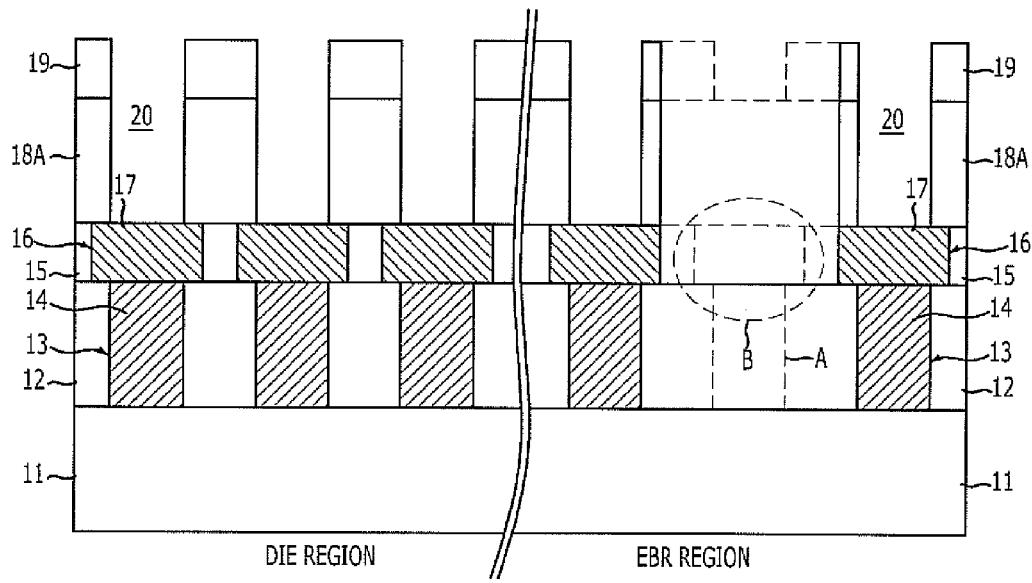

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

FIGS. 2A to 2E are cross-sectional views illustrating a method for fabricating a semiconductor device in accordance with an embodiment of the present invention.

Figure 2A:
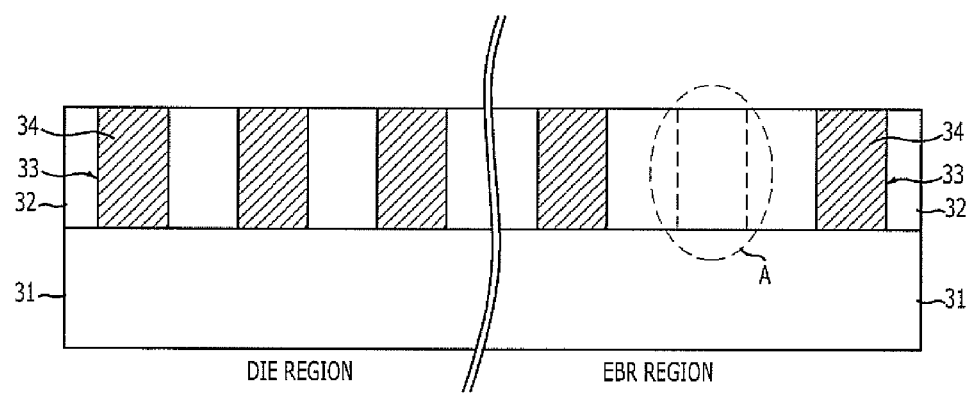
FIGS. 2A to 2E are cross-sectional views illustrating a method for fabricating a semiconductor device in accordance with an embodiment of the present invention.

Referring to FIG. 2A, a first inter-layer dielectric layer is formed over a wafer 31 having a die region where a semiconductor device is formed and an edge bead removal (EBR) region on the outskirt of the wafer 31. The first inter-layer dielectric layer is selectively etched to form a plurality of first contact holes 33. Hereafter, the selectively etched first inter-layer dielectric layer will be referred to as a first inter-layer dielectric layer pattern 32.

Subsequently, a conductive layer for plugs is deposited over the wafer 31 to fill the first contact holes 33, and a planarization process, e.g., a Chemical Mechanical Polishing (CMP) process, is performed in such a manner that the upper surface of the first inter-layer dielectric layer pattern 32 is exposed. As a result, plugs 34 are formed.

Herein, since a process to be performed in the EBR region on the outskirt of the wafer 31 may be abnormally performed, defects such as abnormal formation of the plugs 34 may frequently occur during the formation of the first contact holes 33 and the plugs 34 due to impurities or other reasons (see reference symbol 'A').

Figure 2B:
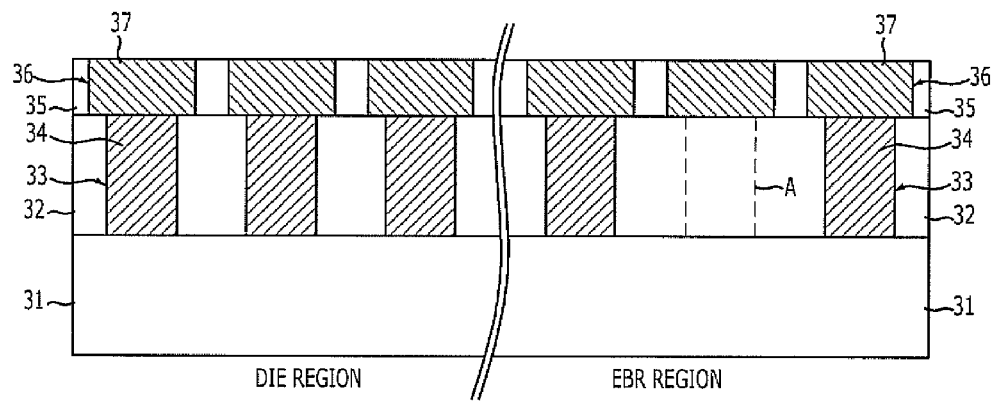

Referring to FIG. 2B, after a second inter-layer dielectric layer is formed over the wafer 31, and the second inter-layer dielectric layer is selectively etched to form trenches 36 for metal lines. Hereafter, the selectively etched second inter-layer dielectric layer is referred to as a second inter-layer dielectric layer pattern 35. The trenches 36 provide the space where metal lines are to be formed. The process for forming the trenches 36 is generally referred to as a Damascene process.

Subsequently, a metal layer is deposited over the wafer 31 to fill the trenches 36, and a planarization process, e.g., a CMP process, is performed in such a manner that the upper surface of the second inter-layer dielectric layer pattern 35 is exposed. As a result, metal lines 37 coupled to the plugs 34 are formed. Herein, the metal lines 37 may be formed of diverse metals such as copper (Cu), aluminum (Al) and so forth.

Figure 2C:
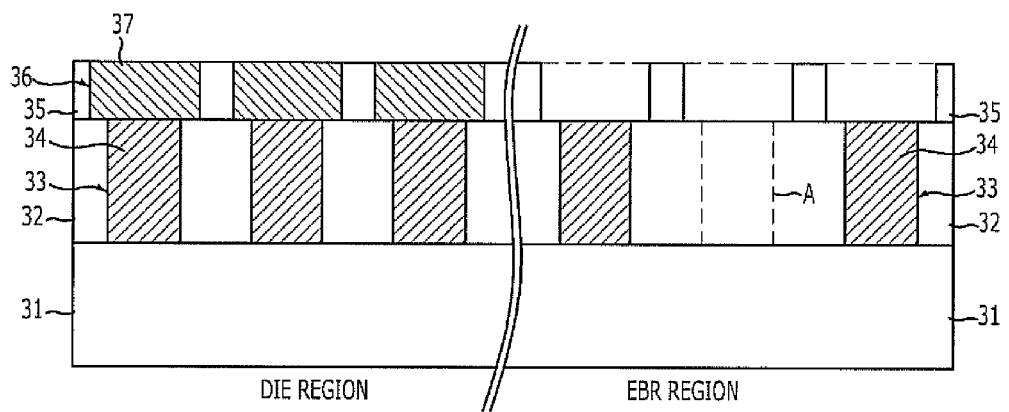

Referring to FIG. 2C, the metal lines 37 formed in the EBR region on the outskirt of the wafer 31 is removed. Herein, the metal lines 37 may be removed through a wet etch process to protect the first inter-layer dielectric layer pattern 32 and the second inter-layer dielectric layer pattern 35 from being damaged due to an arcing failure.

The wet etch process for removing the metal lines 37 can be performed by a spin-type wet etch device designed to spray an etch solution to the EBR region and rotate the wafer 31. Herein, the etch solution may be determined according to the material forming the metal lines 37.

For example, when the metal lines 37 is formed of copper, a nitric acid solution may be used as the etch solution. The nitric acid solution is a mixed solution prepared by mixing deionized water (DI, $H_2O$) with nitric acid ($HNO_3$) in a certain ratio. The mixing ratio of deionized water to the nitric acid ($H_2O:HNO_3$) may range from approximately 1:1 to approximately 1:10. Herein, the mixing ratio is a volume ratio.

Also, when the metal lines 37 are formed of copper, a mixed solution ($HCl/HNO_3/H_2O$) of hydrochloric acid (HCl), nitric acid ($HNO_3$), and deionized water ($H_2O$) may be used as the etch solution. In this case, the proportion of the nitric acid ($HNO_3$) in the mixed solution is adjusted to be equal to or more than a third of the mixed solution. For example, the percentage of the nitric acid ($HNO_3$) in the mixed solution may range from approximately 30% to approximately 70% of the entire mixed solution. Herein, it is based on a volume ratio.

For another example, when the metal lines 37 are formed of aluminum, sodium hydroxide (NaOH) solution may be used as the etch solution. The sodium hydroxide (NaOH) solution is a mixed solution prepared by mixing deionized water ($H_2O$) with sodium hydroxide (NaOH). The mixing ratio ($H_2O:NaOH$) of the deionized water to sodium hydroxide may range from approximately 1:1 to approximately 1:10. Herein, the mixing ratio is a volume ratio.

Also, when the metal lines 37 are formed of aluminum, a mixed solution ($HCl/HNO_3H_2O$) of hydrochloric acid (HCl), nitric acid ($HNO_3$), and deionized water ($H_2O$) may be used as the etch solution. In this case, the proportion of the nitric acid ($HNO_3$) in the mixed solution is adjusted to be equal to or more than a third of the mixed solution. For example, the percentage of the nitric acid ($HNO_3$) in the mixed solution may range from approximately 30% to approximately 70% of the entire mixed solution. Herein, it is based on a volume ratio.

Figure 2D:
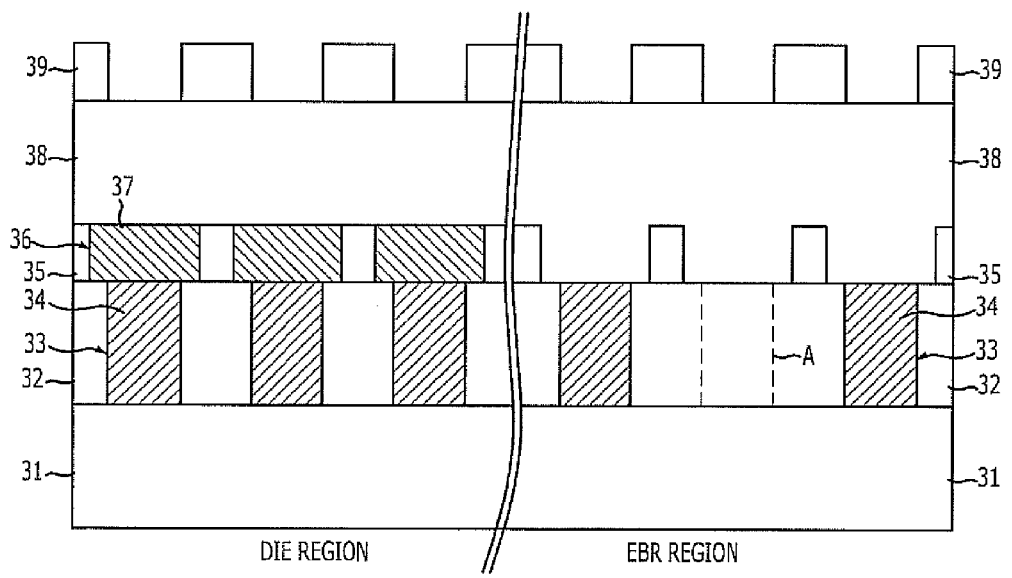

Referring to FIG. 2D, a third inter-layer dielectric layer 38 is formed over the wafer 31, and a photoresist pattern 39 is formed over the third inter-layer dielectric layer 38 to form contact holes that expose the metal lines 37.

Figure 2E:
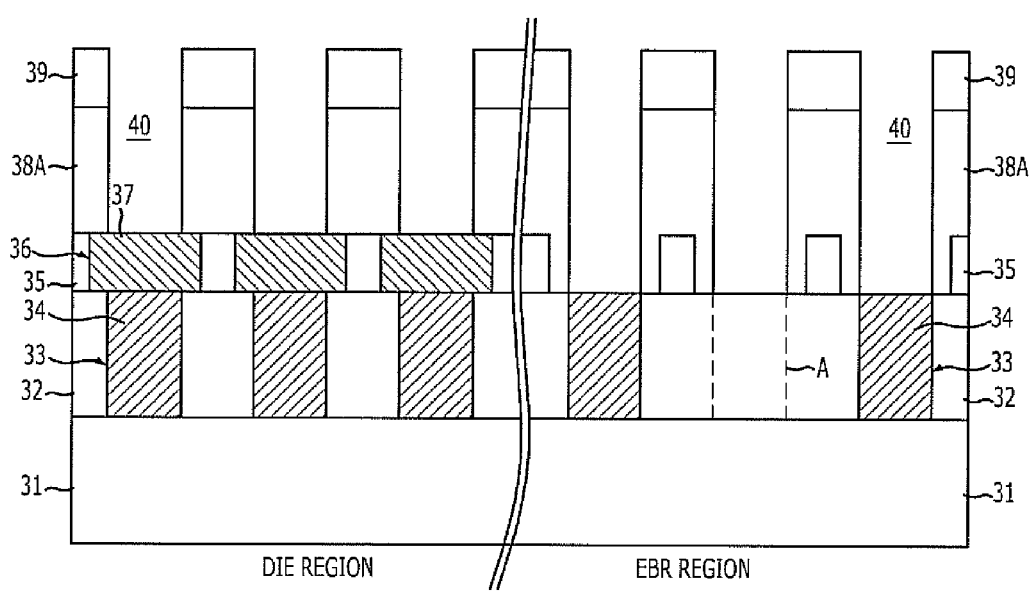

Referring to FIG. 2E, the third inter-layer dielectric layer 38 is etched using the photoresist pattern 39 as an etch barrier to form second contact holes 40 that expose the metal lines 37. The etch process for forming the second contact holes 40 may be a dry etch process using a plasma etch device. Herein, the etched third inter-layer dielectric layer 38 will be referred to as a third inter-layer dielectric layer pattern 38A.

According to exemplary embodiments of the present invention having above-described structure, a semiconductor device prevents/reduces a potential difference in a EBR region during a dry etch process using a plasma etch device by removing a metal line in the EBR region in advance before the formation of contact holes, although a defect occurs in the formation of plugs in the EBR region. An arching phenomenon can be prevented from occurring.

Therefore, it also prevents the reliability of a semiconductor device from being deteriorated due to the arcing phenomenon and simultaneously improves the production yield of the semiconductor device.

While the present invention has been described with respect to the specific embodiments, it will be apparent to those skilled in the art that various changes and modifications may be made without departing from the spirit and scope of the invention as defined in the following claims.

What is claimed is:
1. A method for fabricating a semiconductor device, comprising:
    forming a plurality of plugs over a die region and an edge bead removal (EBR) region of a wafer;
    forming metal lines coupled to the plugs in the die region and the EBR region;

removing the metal lines in the EBR region before an inter-layer dielectric layer is formed;

forming the inter-layer dielectric layer over the wafer; and forming a plurality of contact holes that expose the metal lines in the die region by selectively etching the inter-layer dielectric layer through a dry etch process using a plasma etch device.

2. The method of claim 1, wherein in removing the metal lines in the EBR region, the metal lines are removed through a wet etch process.

3. The method of claim 2, wherein the wet etch process is performed by a spin-type wet etch device configured to spray an etch solution to the EBR region of the wafer and rotate the wafer.

4. The method of claim 1, wherein the metal lines include copper (Cu).

5. The method of claim 4, wherein in removing the metal lines in the EBR region, the metal lines are removed using a mixed solution of nitric acid ($HNO_3$) and deionized water ($H_2O$).

6. The method of claim 5, wherein the mixed solution is prepared by mixing the deionized water with the nitric acid ($HNO_3$) at a mixing ratio ranging from approximately 1:1 to approximately 1:10.

7. The method of claim 1, wherein the metal lines include aluminum (Al).

8. The method of claim 7, wherein in removing the metal lines in the EBR region, the metal lines are removed using a mixed solution of sodium hydroxide (NaOH) and deionized water ($H_2O$).

9. The method of claim 8, wherein the mixed solution is prepared by mixing the deionized water with the sodium hydroxide (NaOH) at a mixing ratio ranging from approximately 1:1 to approximately 1:10.

10. The method of claim 1, wherein in removing the metal lines in the EBR region, the metal lines are removed using a mixed solution ($HCl/HNO_3/H_2O$) of hydrochloric acid (HCl), nitric acid ($HNO_3$), and deionized water ($H_2O$).

11. The method of claim 10, wherein the percentage of the nitric acid ($HNO_3$) in the mixed solution ranges from approximately 30% to approximately 70% of the entire mixed solution.

12. The method of claim 10, further including a second inter-layer dielectric layer formed over the plurality of plugs in both the die region and the EBR region, wherein the forming of the metal lines includes depositing a metal layer to fill trenches formed by etching the second inter-layer dielectric layer in both the die region and the EBR region and wherein the removing of the metal lines in the EBR region includes removing the metal layer filled in the trenches of the EBR region.

* * * * *